United States Patent [19]

Deckman et al.

[11] Patent Number: 4,497,974
[45] Date of Patent: Feb. 5, 1985

[54] REALIZATION OF A THIN FILM SOLAR CELL WITH A DETACHED REFLECTOR

[75] Inventors: Harry W. Deckman, Clinton; Horst Witzke; Christopher Wronski, both of Princeton, all of N.J.

[73] Assignee: Exxon Research & Engineering Co., Florham Park, N.J.

[21] Appl. No.: 443,197

[22] Filed: Nov. 22, 1982

[51] Int. Cl.³ .............................................. H01L 31/06
[52] U.S. Cl. .................................... 136/259; 136/258; 357/30
[58] Field of Search ............... 136/256, 258 AM, 259; 357/30

[56] References Cited

U.S. PATENT DOCUMENTS

| | | | |
|---|---|---|---|
| 3,973,994 | 8/1976 | Redfield | 136/259 |
| 3,993,800 | 11/1976 | Callender | 427/74 |
| 4,400,577 | 8/1983 | Spear | 136/259 |
| 4,419,533 | 12/1983 | Czubatyj et al. | 136/259 |

FOREIGN PATENT DOCUMENTS 55-108780  8/1980  Japan .................... 136/259

Primary Examiner—Aaron Weisstuch
Attorney, Agent, or Firm—Ronald D. Hantman

[57] ABSTRACT

The present invention is an optically enhanced solar cell having a detached reflector. The optically enhanced solar cell includes a semiconductor material bounded on each side by transparent electrical contacts and an optional antireflection coating with the surface of at least one of these layers being textured. Light is reflected in the cell by a reflector which is detached (i.e., spaced) from the enhanced cell using a layer of dielectric material.

10 Claims, 8 Drawing Figures

REALIZATION OF A THIN FILM SOLAR CELL WITH A DETACHED REFLECTOR

BACKGROUND OF THE INVENTION

The present invention concerns photovoltaic semiconductor devices. In particular, the present invention is a device whose absorption of incident radiation is enhanced. Examples of photovoltaic semiconductor devices include solar cells, and photodiodes. Most of the following discussion will be directed towards solar cells; however, the general discussion applies to all photovoltaic devices.

Absorption of light in a solar cell is governed by the optical properties of the semiconductor materials used to form the active layers of the cell. Optical absorption in the active layers imposes constraints on the minimum thickness of the semiconductor materials used to form the cell. Such thickness requirements impose severe purity constraints on the semiconductor materials. This follows because the purity of the active material in part determines the lifetimes of the electron hole pairs that are generated by absorbed light. The lifetimes determine the average length or collection width over which carriers can be collected in the device. To maximize this can require high purity active material. Therefore, it is desirable to enhance the effective absorption within the active material because (1) the thickness of the active material can be reduced and (2) semiconductor purity requirements can be relaxed.

These considerations are particularly important for amorphous and indirect gap semiconductors. In indirect gap semiconductors, like silicon, the solar radiation is weakly absorbed. For silicon more than 50 microns of material is required to effectively absorb solar radiation. If the optical absorption were enhanced, thinner cell thickness would be required and lower purity material could be used. In amorphous silicon, blue light is absorbed in a thickness of less than 1 $\mu$m while near infrared radiation (750–800 nm) requires at least 10 $\mu$m for complete absorption. Since the cell must have a minimum thickness to allow for absorption of incident sunlight, the collection width must be of the order of the cell thickness to allow for the generated electron-hole pairs to contribute to the electric current. Since the collection width for amorphous silicon is at best 1.5 $\mu$m, optical enhancement could provide a significant improvement in the collection efficiency of near infrared radiation. This in turn should allow the overall cell efficiency to be increased.

In the past decade, there have been a number of suggestions for the use of light trapping by total internal reflection to increase the effective absorption in the indirect gap semiconductor, crystalline silicon. The original suggestions (A. E. St. John, U.S. Pat. No. 3,487,223 and O. Krumpholz and S. Moslowski, Z. Angew. Phys. 25, 156 (1968)) were motivated by the prospect of increasing the response speed of silicon photodiodes while maintaining high quantum efficiency in the near infrared.

Subsequently, it was suggested (D. Redfield, App. Phys. Lett. 25, 647 (1974) and D. Redfield, U.S. Pat. No. 3,973,994) that light trapping would have important benefits for solar cells as well. High efficiency could be maintained while reducing the thickness of semiconductor material required. Additionally, the constraints on the quality of the silicon could be relaxed since the diffusion length of minority carriers could be reduced proportionate to the degree of intensity enhancement. With such important advantages, interest in this approach has continued, but no significant advances in the design of optically enhanced solar cells have been made.

SUMMARY OF THE INVENTION

Figure 1:
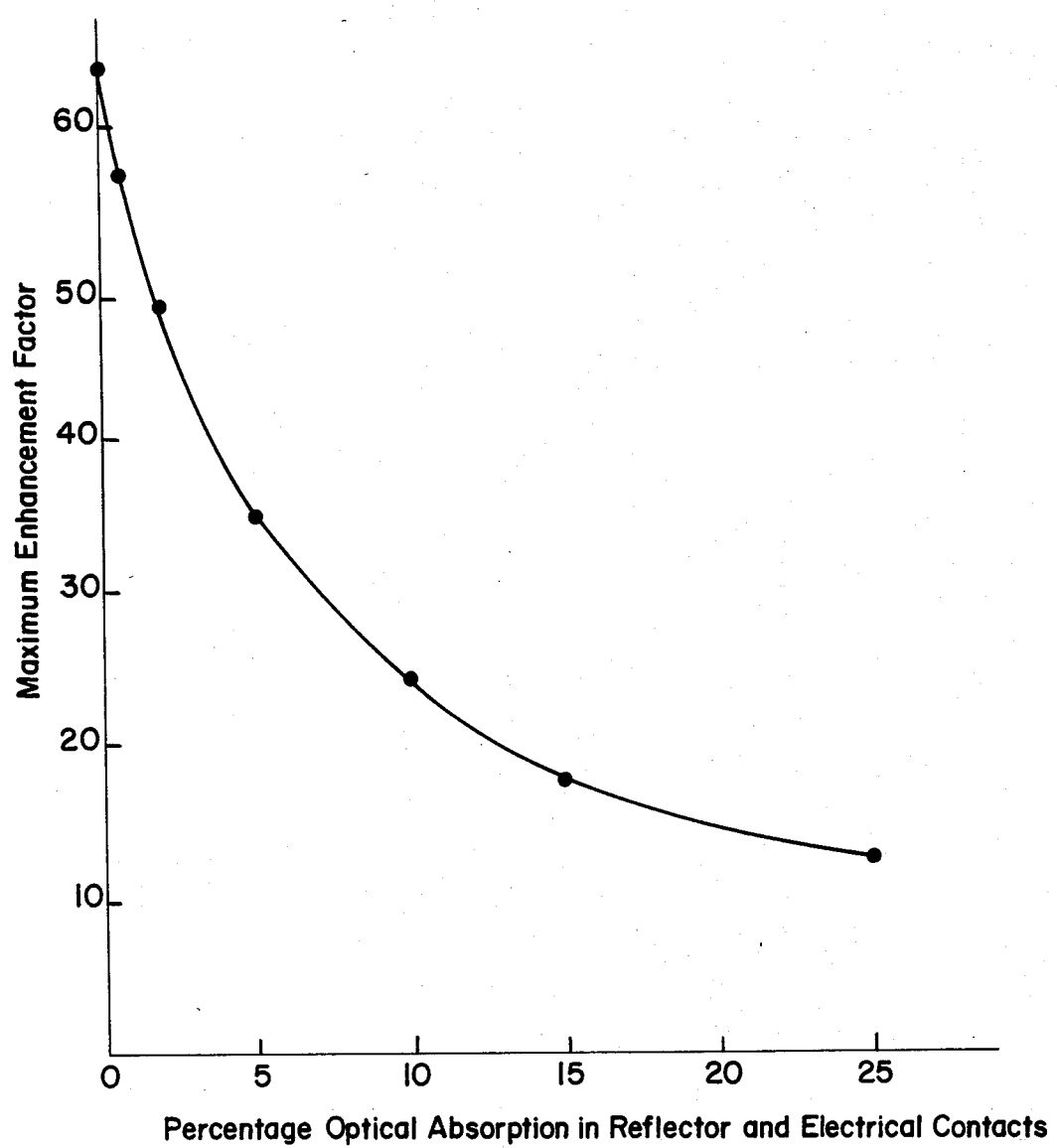
FIG. 1 shows a theoretical plot of the maximum attainable enhancement factor as a function of the percentage optical absorption in the reflector and electrical contacts.

The present invention is an optically enhanced photovoltaic device which includes a layer of semiconductor material bounded on each side by top and bottom layers of transparent electrical conductor with the surface of at least one of the layers being textured; a layer of transparent dielectric material fixed to the bottom layer of the transparent electrical conductor; and a metallic layer fixed to the layer of transparent dielectric material such that radiation incident on the top layer of transparent conductor and the layer of transparent dielectric material is reflected by the metallic layer.

DESCRIPTION OF THE PREFERRED EMBODIMENT

It is well-known that a solar cell contains a semiconductor layer (or layers) which absorbs light, thereby producing electron-hole pairs, as well as a junction which separates the electron-hole pairs, thus producing useful electrical energy. The semiconductor layers (or layer) will be referred to as the active layers. The present invention is applicable to thin film as well as thick film solar cells. A thin film solar cell will be considered to be any cell built up from a substrate which is not part of the solar cell material. A thick film solar cell will be considered to be any cell that can be conveniently fabricated starting with an active layer.

The present invention is an optically enhanced solar cell having a detached reflector. The optically enhanced cell includes a semiconductor material bounded on each side by transparent electrical contacts and an optional antireflection coating, with the surface of at least one of these layers being textured. The antireflection coating, semiconductor material and transparent electrical contacts will be referred to as photovoltaic material. Light is reflected within the cell by a detached reflector. A detached reflector will be defined to be any reflector which reflects light after it has traveled through a dielectric medium an average of more than two optical wavelengths past the rear surface of the transparent electrical contact. For visible light propagating through air, two optical wavelengths corresponds to a distance of approximately 1 micron. The detached reflector may be a metal or a white surface. If the reflector is metallic, it is detached from the cell by interposing a layer of transparent dielectric material between the reflector and the rear surface transparent electrical contact. If the reflector is a white surface, the layer of transparent dielectric material is optional and the white surface can be attached directly to the transparent electrical contact. A white surface is formed by small transparent dielectric particles which scatter light without absorbing either the incident or scattered radiation. Light is reflected from a white surface after it has penetrated an average of more than 5 $\mu$m into the dielectric materials forming the whire reflector. Thus, a detached reflector is formed by a white surface in contact with the transparent electrical contact of a solar cell. Depending upon the sheet conductivity of the transparent electrical contacts and the cell area, it may be desirable to cover the transparent contacts with a fine line metallic grid.

Texturing the surface of at least one of the layers comprising the photovoltaic material or the transparent electrical conductors enhances absorption of incident optical radiation. Enhancement of optical absorption is due to the fact that the texturing breaks the plane-parallel symmetry of the solar cell and permits trapping of incoming light within the semiconductor. Usually the symmetry breaking is produced by texturing either or both surfaces of the semiconductor material. This couples incoming photons into optical modes which are trapped within the semiconductor. The amount of light trapped depends upon details of the texturing. If the scattering surface produces a complete randomization in the direction of light propagation within the semiconductor layer, then it can be shown (see E. Yablonovitch and G. Cody, *IEEE Transactions on Electron Devices*, ED-29, 300 (1982) that the intensity at a given wavelength of light trapped in the active layers never exceeds $4n^2$ (n is the refractive index of the active layers) times the intensity of externally incident light. For semiconductor materials like silicon and a-SiH$_x$, the maximum increase at any wavelength of light intensity within the cell is 40–75 percent. Optical absorption is proportional to light intensity in the cell so the maximum increase in absorption at a given wavelength is 40–75 percent. Such an increase can only be obtained if there is no optical absorption in the reflector. It should be noted that the scattering surface need not randomize the direction of light propagated in the semiconductor. Optical absorption can be enhanced with periodically textured surfaces as well as with randomly textured surfaces. In all cases, optical absorption in the reflector should be minimized.

The magnitude of the optical enhancement effect is quite sensitive to optical absorption within the electrical contacts and reflector. Minimizing optical absorption in the electrical contacts and the reflector maximizes the enhancement effect. FIG. 1 shows the effect of such parasitic absorptions on the theoretical value for the maximum attainable enhancement of light intensity in a semiconductor layer having an index of refraction equal to 4. The abscissa of FIG. 1 is the parasitic absorption due to the transparent electrical contacts and reflector. The ordinate in FIG. 1 is the maximum attainable increase of light intensity at a given wavelength in the cell due to enhancement. FIG. 1 is applicable when the enhancement is produced by a randomization of the direction of light in the semiconductor medium. It is seen that if the parasitic absorption is only 7%, the maximum attainable enhancement will be only $\frac{1}{2}$ of that with no absorption. It should also be noted that 2.5% parasitic absorption reduces the maximum attainable enhancement by a factor 1.4. Thus, it is important to minimize parasitic absorptions in optically enhanced solar cells. Such considerations are not as important in unenhanced cells. For instance, reducing optical absorption in the reflector of an unenhanced cell from 10% to 2% (at a given wavelength) can increase the light intensity in the cell by no more than 5% rather than 125% which might be attained in an enhanced cell. Thus it is much more important to reduce optical absorption in the reflector of an optically enhanced cell than for a comparable cell which does not utilize optical enhancement.

It is the object of the present invention to provide a configuration for an optically enhanced solar cell in which absorption in the reflector is minimized. To minimize optical absorption, the reflector is detached from the rear surface electrical contact. By reflecting light after it has traveled more than two optical wavelengths (or approximately 1 $\mu$m) past the rear surface electrical contact, optical absorption in the reflector can be reduced to less than 1.5%. Such low optical absorption in the reflector cannot be achieved with conventional reflector geometries. In the prior art, optically enhanced solar cells have been constructed with metallic reflectors in direct contact with either the active layers or a transparent conductor. The following discussion will compare optical absorption for conventional and detached reflector geometries.

The reflectivity of a metal in direct contact with a semiconductor having a high index of refraction is significantly less than if it were in contact with air. Thus, many metals which are normally considered to be good reflectors in air, will not produce a large optical enhancement if deposited directly on a semiconductor. Table I lists the optical absorption of normally incident light by a flat metal film deposited on a thick layer of a-SiH$_x$ (taken to be a representative semiconductor).

TABLE I

| OPTICAL ABSORPTION IN METALS DEPOSITED ON THICK FILMS OF a-SiH$_x$ | | |
|---|---|---|
| Metal | % Optical Absorption of Metal Deposited on a-SiH$_x$ | % Optical Absorption in Air |
| Ag | 8 ± 2 | 2 |
| Au | 8 ± 2 | 3.5 |
| Cu | 8 ± 2 | 4.5 |
| Al | 33 ± 3 | 10 |
| Mg | 80 ± 4 | — |
| Ni | 61 ± 3 | 35 |
| Cr | 66 ± 4 | — |
| Pt | 76 ± 7 | — |

In Table I optical absorption is computed from the optical constants of metals. The refractive index of amorphous silicon is taken to be 4. Light is assumed to be normally incident and wavelength is taken to be 7,500 Å. In an optically enhanced cell, light will not necessarily be normally incident on the reflector, so the values shown in Table I should only be taken as representative. In fact, absorption in the reflector of an enhanced cell can be significantly above the values shown in Table I. For good reflectors like Ag, Cu, or Au, texturing can significantly increase optical absorption. The optical properties of Cu, Ag and Au are such that solid state plasma oscillations (plasmons) may be strongly excited on roughened surfaces and such oscillations can significantly increase optical absorption (see S. Garoff, D. A. Weitz, T. J. Gramila, and C. D. Hanson, *Optics Letters* 6, 245 (1981)).

By detaching a metallic reflector from the rear surface electrical contact optical absorption in the reflector can be reduced because (1) the reflector will be in contact with a lower index dielectric material and (2) the reflector does not have to be textured. If the reflector is metallic and in direct contact with the semiconductor, optical absorption in the reflector will be significantly more than 4%. If a metallic reflector is in direct contact with a transparent conductor such as indium tin oxide, the optical absorption will be more than 3%. For any particular metal, optical absorption in the metallic layer of an optimized detached reflector will be less than if the metal were contacted to a semiconductor or to a transparent conductor.

Figure 2:
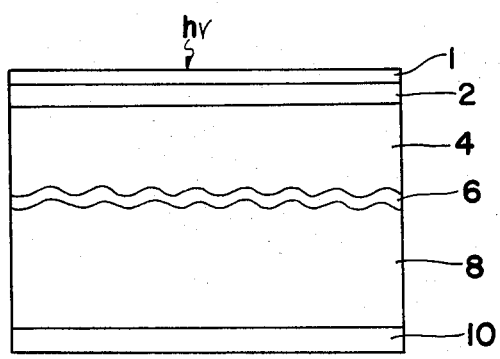
FIG. 2 shows an optically enhanced solar cell with detached metallic reflector.
Figure 3:
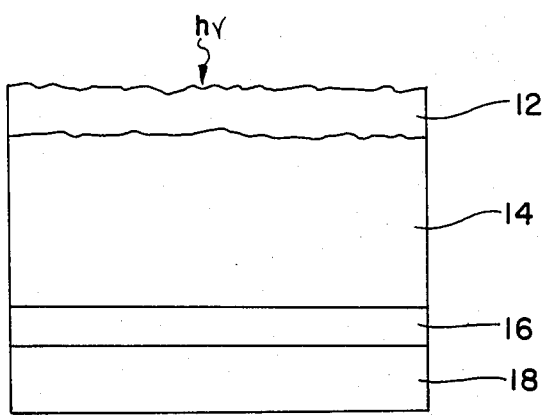
FIG. 3 shows an optically enhanced solar cell using a white surface as a detached reflector.

FIGS. 2 and 3 show how detached reflectors can be incorporated into optically enhanced solar cell configurations. FIG. 2 shows a schematic diagram of an optically enhanced solar cell having a detached metallic reflector 10. The rear surface of the semiconductor layer (or layers) 4 is textured, thereby enhancing optical absorption in the cell. Light enters the cell through the front surface transparent electrical contact 2 and can be scattered at the interface between the semiconductor 4 and a rear surface transparent electrical contact 6 is attached to a transparent dielectric layer 8 which in this case supports a metallic reflector 10. In some cases it may be desirable to overcoat the transparent conductor with an anti-reflection layer 1. Inclusion of this layer is optional since in many cases the thickness of the transparent electrical contact can be adjusted to provide an effective antireflection coating. In many cell designs one or both of the transparent electrical contacts 2 or 6 are made from doped semiconducting materials. In those cases, the transparent contacts 2 and 6 are part of the semiconducting material 4. The dielectric layer 8 shown in FIG. 2 does not necessarily have to support the detached reflector 10. For instance, the dielectric layer 8 could be an air gap, in which case the detached reflector 10 would have to be self supporting. In all cases the detached reflector 10 is located more than 0.15 $\mu$m away from the rear surface transparent electrical contact 6. Often it is convenient to detach the reflector 10 more than 1 mm from the rear surface electrical contact 6.

FIG. 3 shows a schematic diagram of an optically enhanced solar cell which utilizes a white surface 18 as a detached reflector. Texturing on the front surface of the semiconductor layer 14 enhances absorption of optical radiation within the cell. Light (h$\gamma$) enters the cell through a textured transparent contact 12 attached to the textured surface of a semiconductor layer 14. A white surface 18 is attached to the rear surface transparent electrical contact 16. The average depth from which light is reflected by the white surface 18 is more than 5 $\mu$m away from the interface between the white surface 18 and the rear surface transparent electrical contact 16. Thus, the white surface 18 serves as a detached reflector for the optically enhanced solar cell. It should be noted that a transparent dielectric layer could be inserted between the white surface 18 and the rear surface transparent electrical contact 16 with no loss in cell performance. A more detailed discussion of the embodiments of the present invention follows below.

All of the transparent electrical contacts 2, 6, 12 and 16 of FIGS. 2 and 3 should have several properties including, obviously, optical transparency. To significantly enhance the efficiency of a solar cell, the transparent conductor should absorb no more than 3% of light in the spectral region of interest. It is preferred that no more than 1% of the light be absorbed in both contacts. For instance, if an optically enhanced amorphous silicon solar cell is being fabricated, the single pass optical absorption for the transparent conductor should be no more than about $\frac{1}{2}$% in the spectral region from 650–800 nm. If an optically enhanced crystalline silicon cell is being fabricated, then the transparent electrical contact should have a single pass absorption of less than about $\frac{1}{2}$% in the spectral region from 1–1.15 $\mu$m, where light is weakly absorbed by silicon. The conductor should also have conductivity $<50$ $\Omega/\square$. It should not diffuse into the photovoltaic material. The conductor should be thick enough to texture for those embodiments where the conductor is textured.

In the embodiments shown in FIGS. 2 and 3, the transparent conductor 2 and 12 can act as an anti-reflection layer. For the transparent conductor to serve as an anti-reflection layer, its optical thickness after texturing should be approximately $\frac{1}{4}\lambda$ or $\frac{3}{4}\lambda$, where $\lambda$ is the wavelength of light in the active layers of the cell. If the active material 4 and 14 in the cell is amorphous silicon, then the average thickness of a transparent conductor with refractive index $\eta \approx 2.2$, should be either 500 Å or 1,500 Å to provide an anti-reflection layer. Materials that are suitable as transparent conductors include reactively sputtered indium-tin-oxide (ITO), ITO prepared by chemical vapor deposition, SnO$_2$, In$_2$O$_3$, and CdSnO$_4$. Also, doped semiconductors can be used in some cases as a transparent conductor.

If the transparent electrical contact 2 and 12 does not act as an anti-reflection layer then an anti-reflection coating can be incorporated on the front of the cell.

A transparent dielectric medium 8 can be interposed between the detached reflector (10 and 18), and the rear surface transparent electrical contact (6 and 16). The dielectric medium 8 may be either homogeneous or a heterogeneous series of dielectric layers. In either case the layers should be optically transparent so that no more than 1/10% of the light is absorbed by the dielectric. Suitable dielectric materials include glass, SiO$_2$, Al$_2$O$_3$, air, and plastics such as polystyrene, or polymethylmethacrylate. If the detached reflector 10 is a metal then the dielectric material should have as low an index of refraction as practical a preferred value for the index of refraction of the dielectric material is less than 2.

The detached reflector can be either a metal or a white surface. It is preferred that the single pass optical absorption in the reflector at the wavelength being enhanced be less than $1/n^2$ of the photons incident where n is the index of refraction for the semiconductor. If the single pass optical absorption in the reflector is greater than $1/n^2$, then optical enhancement will be greatly diminished. If the detached reflector is metallic, it is preferable that it be made from a flat layer of Cu, Ag or Au when enhancement is desired at wavelengths longer than 700 nm. In all cases it is desired that the metallic reflector be substantially flat and parallel to the plane defined by the rear surface transparent conductors 6 and 16. If the detached reflector consists of a white surface then it can be made from particles of teflon, MgO, $SiO_2$, $CaCO_3$, or cellulose. Many white paints have a low enough optical absorption to serve as the white surface of a detached reflector.

The semiconductor 4 and 14 may be a homogeneous material containing doped layers or a heterogeneous series of semiconductor layers. In either case one of the layers may also serve as a transparent electrical contact 2, 16, 12, or 16. If the semiconductor 4 and 14 is heterogeneous, then a junction may be formed between at least two of the layers. Examples of heterogeneous semiconductor materials include: (1) GaAs solar cells containing sequential layers of p-type $Al_{0.8}$, $G_{0.2}As$, p-type GaAs and n-type GaAs; and (2) solar cells made from a layer of $Cu_2S$ in contact with CdS, and (3) heterojunctions between p-type amorphous $Si_xCH_y$ and amorphous $SiH_x$. Examples of homogeneous semiconductor materials include: (1) crystalline silicon solar cells made from sequential layers of n type, p type and P+ Si; (2) PIN amorphous silicon (a-$SiH_x$) solar cells containing p type, intrinsic, and n-type amorphous silicon: (3) Schottky barrier cells containing intrinsic and n-type amorphous silicon.

To scatter light within the semiconductor, the surface of at least one of the layers comprising the photovoltaic material of the transparent electrical conductors must be textured. The texture should be of a scale length small enough so that light is scattered, rather than geometrically reflected by the texture.

In general, it is preferred that the texture be comprised of microstructures having a scale length of the order of the wavelength of visible light in the semiconductor material. Arrangement of the microstructures can be either random or periodic. Examples of microstructures which are useful in scattering light include 0.05–2 μm wide microstructural pits in the semiconductor surface, grating structures on the semiconductor surface having periodicity of 0.05–2 μm and post structures 0.05–2 μm wide on the surface of at least one of the transparent electrical contacts.

To further illustrate the invention the application of the detached reflector concept to the enhancement of a-SiHx solar cells will be described.

From the foregoing description, it will be apparent that there has been provided an improved reflector geometry for optically enhanced photovoltaic devices. Variations and modifications in the herein described device within the scope of this invention will undoubtedly suggest themselves to those skilled in the art. Accordingly, the foregoing description should be taken as illustrative and not in a limiting sense.

EXAMPLE 1

Figure 4:
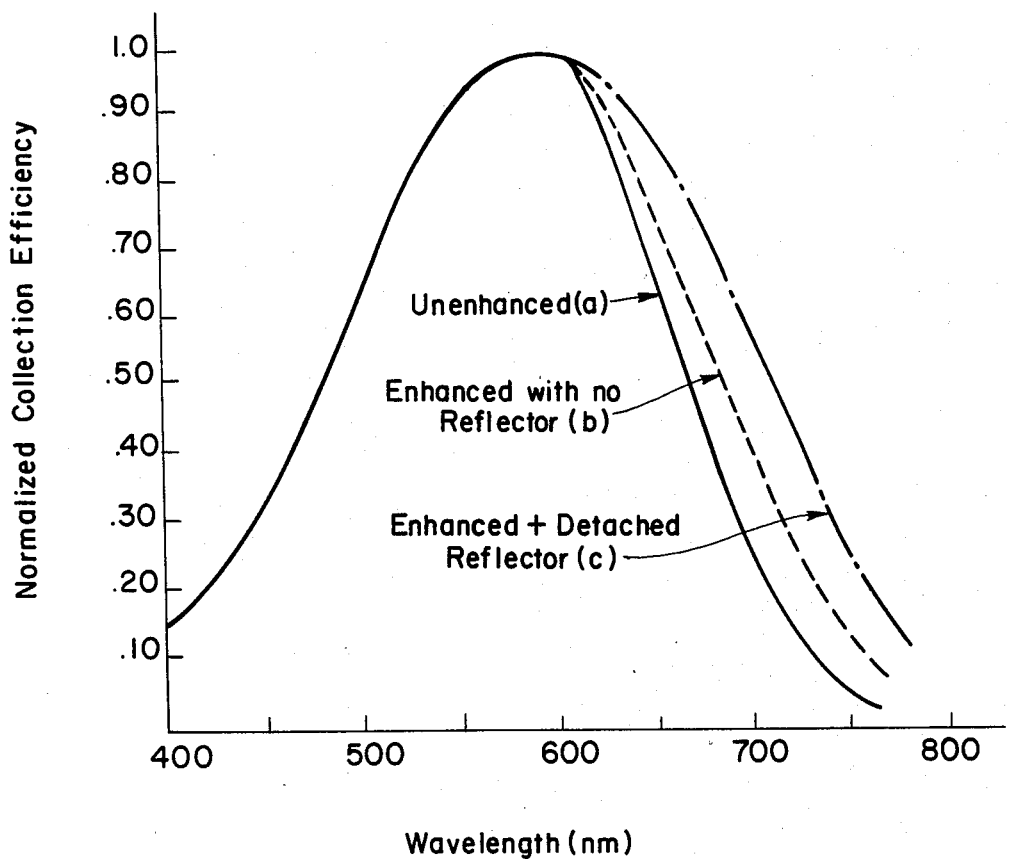
FIG. 4 shows the collection efficiency spectra of three different amorphous silicon solar cells: Curve a shows the collection efficiency of unenhanced silicon solar cells. Curve b shows the improvement of collection efficiency in an equivalent unenhanced cell with no reflector. Curve c shows the improvement of collection efficiency due to the addition of a detached reflector to an enhanced cell.

To demonstrate the present invention, optically enhanced solar cells were prepared with and without detached reflectors. For comparison, equivalent unenhanced cells were also prepared. The quantum efficiency for collection of photogenerated carriers was measured as a function of wavelength using techniques described by C. R. Wronski, B. Abeles, and G. D. Cody, *Solar Cells* 2, 245 (1980) and C. R. Wronski, B. Abeles, G. Cody, and T. Tiedje, *Appl. Phys. Lett.* 37, 96 (1980). The normalized quantum efficiency for collection of carriers is shown in FIG. 4 for unenhanced cells (curve a), enhanced cells without detached reflectors (curve b) and enhanced cells with detached reflectors (curve c). It is seen that the largest improvement in infrared response is produced by an enhanced solar cell having a detached reflector (curve c). This improvement in carrier collection efficiency can be directly related to improvement in solar cell efficiency. The methods used to fabricate equivalent unenhanced a-SiHx solar cells are described below.

Fabrication of Unenhanced Cells (1) A flat glass cover slip was coated with a layer of transparent conductor. The transparent conductor was a 500 Å thick layer of sputter deposited indium-tin oxide.

(2) An 8,500 Å thick PIN a-SiHx solar cell structure was deposited on top of the transparent conductor. To prepare PIN a-SiHx solar cell structures, the deposition methods described below were utilized. All layers of a-SiHx were deposited using a glow discharge deposition process. Substrates were heated in vacuum to 215° C. and silane gas was flowed through the reactor at approximately 100 sccm, producing a pressure in the reactor chamber of approximately 100 mTorr. A glow discharge was initiated using approximately 8 watts of 13.56 MHz radiation. Samples were affixed to the electrodes (cathode and anode) and the anode samples were found to be superior to those produced on the cathode. Electrodes were 6 in. diameter disks separated by 1.5 in. During the deposition, the cathode acquired a bias of 10 volts with respect to the grounded anode. Doping of the a-SiHx semiconductor was accomplished by incorporating 0.7% $B_2H_6$ or $PH_3$ into the gas entering the reactor. Incorporation of boron produces p-type material while incorporation of phosphorous produces n-type material. To produce a PIN a-SiHx structure, a layer of p-doped a-SiHx was deposited to a thickness of 1,250 Å. Without shutting off the plasma, the dopant was removed from the gas entering the reactor and 7,000 Å of a-SiHx was deposited. To provide an ohmic contact to the device a layer of n-doped a-SiHx was deposited to a thickness of approximately 200 Å on top of the other layers.

(3) To form solar cells a front surface transparent conductor was deposited on top of the n-doped a-SiHx layer. The transparent conductor was a 2 $mm^2$ dot of sputter deposited indium-tin oxide.

Fabrication of Enhanced Cells (1) The surface of a cover slip was textured using a lithographic technique. The lithographic technique used to texture the cover slip is referred to as Natural Lithography and details of the technique are given by H. Deckman and J. H. Dunsmuir, *App. Phys. Lett.* 41, 377 (1982). A densely packed random array of 3,000 Å polymer spheres was coated onto the surface of the cover slip. A 500 ev reactive ion beam produced from a $CF_4$ gas discharge was used to etch the surface of the polymer sphere coated glass substrate. Etching of the substrate was terminated after about 2,000 Å of glass had been removed. The remaining polymer was chemically removed.

(2) The textured cover glass was utilized as a substrate and steps 1, 2, and 3 used in fabrication of unenhanced cells were repeated.

Fabrication of Enhanced Cells with Detached Reflectors (1) Enhanced cells were fabricated using the method described above.

(2) The rear surface of the cover slip was coated with an evaporated 2,500 Å thick layer of Ag.

EXAMPLE 2

Figure 5:
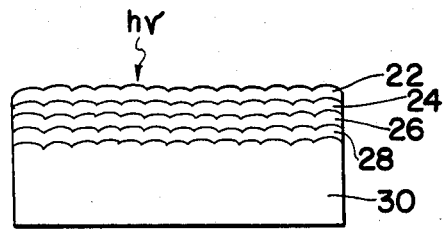
FIG. 5 shows an enhanced solar cell containing an integral reflector structure.
Figure 6:
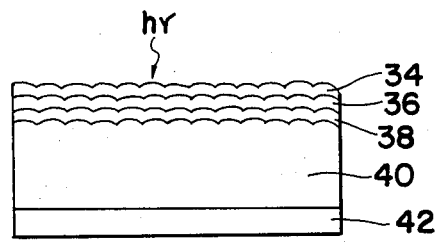
FIG. 6 shows an enhanced solar cell containing a detached metallic reflector.

Performance of optically enhanced a-SiHx solar cells having a tuned reflector (described in more detail below) was compared with optically enhanced cells having a detched reflector. It was found that enhanced cells with a detached reflector produced 0.75 mA/cm$^2$ improvement in short circuit current over enhanced cells with a tuned reflector. Thus, the detached reflector produces a 5-7% improvement in cell efficiency over enhanced cells having a tuned reflector. This improvement is attributed to the reduction of optical absorption in the detached reflector geometry. Arrangement of a-SiHx solar cells having tuned and detached reflectors is shown in FIGS. 5 and 6, respectively.

The enhanced cells having tuned reflectors (FIG. 5) were constructed as follows:

(1) The surface of a glass cover slip was lithographically textured with densely packed post structures of 0.5 μm diameter and 4,000 Å height (See e.g., H. Deckman and J. H. Dunsmuir, *Appl. Phys. Lett.* 41, 377 (1982). The lithographically textured glass cover slip (30) serves as a support for the cell structure.

(2) A 2,000 Å thick silver reflector (28) was deposited on top of the textured glass cover slip (30).

(3) A layer of transparent conductor (26) was deposited over the silver. The transparent conductor (26) was a 1,000 Å thick layer of sputter deposited indium-tin oxide. The silver reflector (28) overcoated with transparent conductor (26) is called a tuned reflector.

(4) A 9,000 Å thick PIN a-SiHx solar cell structure (24) was deposited on top of the transparent conductor (26).

(5) A transparent electrical contact (22) was deposited on the front surface of the cell. Indium-tin oxide dots of 2 mm$^2$ area were sputter deposited through a lithographic mask to form a transparent electrical contact (22) to the cell.

Enhanced a-SiHx solar cells having detached reflectors (See FIG. 6) were prepared as follows:

(1) The surface of a glass cover slip was lithographically textured with densely packed post structures of 0.5 μm diameter and 4,000 Å height. The lithographically textured cover slip (40) serves as support of the solar cell structure and is also part of the detached reflector.

(2) A layer of transparent conductor (38) was deposited on the textured cover slip (40). The transparent conductor (38) was a 1,000 Å thick layer of sputter deposited indium-tin oxide.

(3) A 9,000 Å thick PIN a-SiHx solar cell structure (36) was deposited on top of the transparent conductor (38).

(4) A transparent electrical contact (34) was deposited on the front surface of the cell. Indium-tin oxide dots of 2 mm$^2$ area were sputter deposited through a lithographic mask to form a transparent electrical contact (34) to the cell.

(5) A 4,000 Å thick silver layer (42) was deposited by evaporation on the rear surface of the textured cover slip (40). The transparent cover slip (40) and silver layer (42) form a detached reflector.

EXAMPLE 3

To further illustrate the invention we describe the fabrication of optically enhanced amorphous SixCHy: SiHx heterojunction solar cells incorporating a detached reflector.

Figure 7:
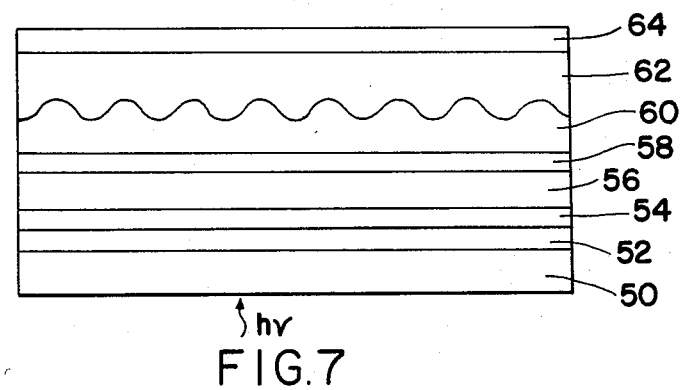
FIG. 7 shows another embodiment of an enhanced solar cell containing a detached reflector.

The cell shown in FIG. 7 can be fabricated as follows:

(1) a 500 Å thick layer of transparent conductor 52 is coated onto flat glass substrate 50.

(2) A 200 Å thick layer 54 of p-doped amorphous SixCHy is deposited on top of the transparent conductor 52. The amorphous SixCHy layer 54 is deposited using a glow discharge deposition technique.

(3) An 8,000 Å thick layer 56 of intrinsic a-SiHx is glow discharged on top of the amorphous SixCHy layer 54.

(4) A 200 Å thick layer 58 of n-doped a-SiHx is glow discharged deposited on top of the intrinsic a-SiHx 56.

(5) A transparent conductor 60 1,000 Å thick is deposited on the n-doped a-SiHx 58 so that the upper surface of the transparent conductor is textured. Deposition techniques which can produce a textured surface on a transparent conductor include spray pyrolysis, and simultaneous ion beam deposition-etching. Alternatively, a flat transprent conductor layer can be deposited on the n-doped a-SiHx 58 and the surface textured using the lithographic methods previously described. This process would also yield the textured transparent conductor layer 60 shown in FIG. 7.

(6) A layer of plastic 62 is spin coated onto the surface of the textured transparent conductor. The spin coating process can be optimized to produce a flat upper surface on the plastic. Alternatively, a moulding process can be used to attach a plastic layer 62 to the textured transparent conductor. It should be noted that the plastic layer acts as an encapsulant for the cell.

(7) A layer of silver 64 is deposited on top of the substantially flat surface of the plastic 62. The plastic layer 62 taken with the silver reflector 64 forms a detached reflector.

Figure 8:
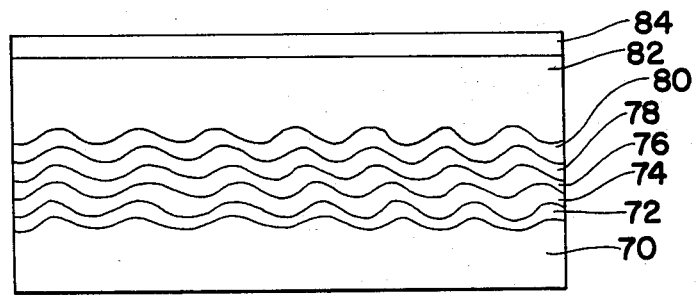
FIG. 8 shows another embodiment of an enhanced solar cell containing a detached reflector.

The cell shown in FIG. 8 can be fabricated as follows:

(1) The surface of a flat glass substrate 70 is lithographically textured to produce microstructures with dimensions of the order of the wavelength of light in the semiconductor. Methods to produce such lithographically defined texture have been previously described.

(2) A 500 Å thick transparent conductor 72 is deposited onto the surface of the textured glass substrate 70.

(3) A 200 Å thick layer of p-doped amorphous SixCHy 74 is deposited onto the transparent conductor 72.

(4) An 8,000 Å thick layer 76 of intrinsic a-SiHx is glow discharge deposited onto the p-doped amorphous SixCHy layer 74.

(5) A 2000 Å thick layer 78 of n-doped a-SiHx is glow discharge deposited on top of the intrinsic a-SiHx layer 76.

(6) A transparent conductor 80 approximately 500 Å thick is deposited on top of the n-doped a-SiHx layer 78.

(7) A layer of plastic 82 is spin coated onto the surface of the transparent conductor. The spin coating process can be optimized to coat the transparent conductor 80 with a plastic layer 82 whose upper surface is substantially flat. Alternatively, a moulding process can be used to attach a plastic layer 82 with a flat upper surface to the transparent conductor.

(8) A layer of silver 84 is deposited on the substantially flat surface of the plastic 82. The plastic layer 82 taken with the silver reflector 84 forms a detached reflector.

What is claimed is:

1. An optically enhanced photovoltaic device comprising:
   (a) A layer of semiconductor material contacted on its upper and lower major surfaces by respective top and bottom layers of transparent electrical conductors each having a top and bottom surface with at least one of said surfaces being textured so as to scatter incident light randomly;
   (b) a layer of transparent dielectric material fixed to said bottom surface of said bottom layer of said transparent electrical conductor;
   (c) a metal layer fixed to said layer of transparent dielectric material such that radiation incident on said top layer of transparent conductor and which passes through said bottom layer of transparent conductor and said layer of transparent dielectric material is reflected by said metal layer.

2. The device of claim 1 wherein the interface between said dielectric layer and said metal layer is substantially flat.

3. The device of claim 2 wherein said metal has a reflectivity of greater than 95%.

4. The device of claim 3 wherein said metal is selected from the group consisting of copper, silver, gold, and aluminum.

5. The device of claim 2 wherein the interface between said dielectric layer and said metal layer is substantially parallel to the plane defined by the bottom surface of said bottom transparent conductor.

6. The device of claim 1 wherein said dielectric layer has an index of refraction of less than 2.

7. The device of claim 1 wherein said top layer of said transparent conductor further comprises a layer of antireflection material on the side away from the semiconductor layer.

8. The device of claim 1 wherein all of said textured surfaces have characteristic scale length of the order of the wavelength of light in said semiconductor material.

9. The device of claim 1 wherein said semiconductor material is amorphous silicon.

10. The device of claim 1 wherein at least one of said upper and lower major surfaces of said semiconductor material is textured.

* * * * *